United States Patent
Cho (10) Patent No.: US 8,873,331 B2
(45) Date of Patent: Oct. 28, 2014

(54) COMMAND DECODERS

(75) Inventor: Yong Deok Cho, Yongin-si (KR)

(73) Assignee: SK Hynix Inc., Gyeonggi-do (KR)

(*) Notice: Subject to any disclaimer, the term of this patent is extended or adjusted under 35 U.S.C. 154(b) by 315 days.

(21) Appl. No.: 13/591,339

(22) Filed: Aug. 22, 2012

(65) Prior Publication Data

US 2013/0223177 A1    Aug. 29, 2013

(30) Foreign Application Priority Data

Feb. 24, 2012  (KR) .......................... 10-2012-0019324

(51) Int. Cl.
*G11C 8/00*    (2006.01)
(52) U.S. Cl.
USPC ................................. 365/230.06; 365/230.08
(58) Field of Classification Search
USPC ............... 365/230.06, 230.08, 233.1, 233.12
See application file for complete search history.

(56) References Cited

U.S. PATENT DOCUMENTS 6,377,509 B2 * 4/2002 Yagishita ................. 365/230.06
2006/0092741 A1 * 5/2006 Kim et al. ..................... 365/222

* cited by examiner

*Primary Examiner* — Vu Le
(74) *Attorney, Agent, or Firm* — William Park & Associates Patent Ltd.

(57) ABSTRACT

Command decoders are provided. The command decoder includes an input buffer configured for buffering and receiving command address signals having address information and command information at first, second, third, and fourth edges of a clock pulse signal according to a reference voltage, a latch circuit configured for latching the command address signals output from the input buffer at the first and third edges of the clock pulse signal to generate and output latched signals, a first command generator configured for decoding the latched signals output from the latch circuit at the first edge of the clock pulse signal to generate and output a first internal command, and a second command generator configured for decoding the latched signals output from the latch circuit at the third edge of the clock pulse signal to generate and output a second internal command.

20 Claims, 5 Drawing Sheets

COMMAND DECODERS

CROSS-REFERENCES TO RELATED APPLICATIONS

The present application claims priority under 35 U.S.C 119(a) to Korean Application No. 10-2012-0019324, filed on Feb. 24, 2012, in the Korean Intellectual Property Office, which is incorporated herein by reference in its entirety.

BACKGROUND

1. Technical Field

Embodiments of the present disclosure relate to integrated circuit devices and to command decoders.

2. Related Art

Mobile devices, including portable computers, personal digital assistants (PDAs), and cellular phones, may be reduced in weight in an effort to increase their portability. Batteries and semiconductor memory chips may be the important elements that directly influence the weight of a mobile. In the event that power consumption of the semiconductor memory chips (hereinafter, referred to as 'mobile memory chips') is lowered, capacity of the batteries can be reduced leading to a decrease in weight of the mobile devices. Accordingly, high performance mobile memory chips, for example, low power mobile memory chips have been continuously required to increase the portability of the mobile devices.

Mobile devices have been developed into multimedia devices providing various and diverse services. Thus, high performance mobile devices with fast operation speeds are required to support the multimedia devices. Data transmission speeds of the mobile memory chips may be an important factor that can directly influence the operation speeds of the mobile devices. Accordingly, a lot of efforts have been focused in on improvements of the data transmission speeds of the mobile memory chips.

Recently, low power double data rate 2 synchronous dynamic random access memory (LPDDR2 SDRAM; hereinafter, briefly referred to as 'LPDDR2') chips have been developed to significantly improve the power consumption and data transmission speed of the mobile devices. The LPDDR2 chips may exhibit the data transmission speed of about 8000 Mbps at a low power voltage of about 1.2 Volts. Further, the LPDDR2 chips may be fabricated using a process technology having a design rule of about 66 nanometers and may be encapsulated to have a planar package size of about 9×12 mm$^2$.

The LPDDR2 chips may simultaneously receive command data and address data through 10 pins. That is, the signals received through the 10 pins include both command information and address information. A command decoder may decode the command data to generate command signals, and an address decoder may decode the address data to generate address signals.

SUMMARY

Embodiments are directed to command decoders.

According to an embodiment, a command decoder includes an input buffer configured for buffering and receiving command address signals having address information and command information at first, second, third, and fourth edges of a clock pulse signal according to a reference voltage, a latch circuit configured for latching the command address signals output from the input buffer at the first and third edges of the clock pulse signal to generate and output latched signals, a first command generator configured for decoding the latched signals output from the latch circuit at the first edge of the clock pulse signal to generate and output a first internal command, and a second command generator configured for decoding the latched signals output from the latch circuit at the third edge of the clock pulse signal to generate and output a second internal command.

According to an embodiment, a command decoder includes a latch circuit configured for latching command address signals having address information and command information in a time duration including first, second, third, and fourth edges of a clock pulse signal to generate latched signals, the command address signals being latched at the first and third edges of the clock pulse signal; a first decoder configured for decoding the latched signals at the time that a pulse of a first pulse signal occurs, thereby generating a first internal command; and a first pulse signal generator configured for generating the first pulse signal including a pulse occurred in synchronization with the first edge of the clock pulse signal when the first internal command is generated.

According to an embodiment, a command decoder includes an input buffer configured for buffering and receiving command address signals having address information and command information at first and third edges of a clock pulse signal according to a reference voltage; and a latch circuit configured for latching the command address signals output from the input buffer at the first and third edges of the clock pulse signal to generate and output latched signals.

BRIEF DESCRIPTION OF THE DRAWINGS

Embodiments of the inventive concept will become more apparent in view of the attached drawings and accompanying detailed description.

DETAILED DESCRIPTION

Embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will convey the scope of the disclosure to those skilled in the art. In the drawings, the same reference numerals or the same reference designators denote the same elements throughout the specification.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
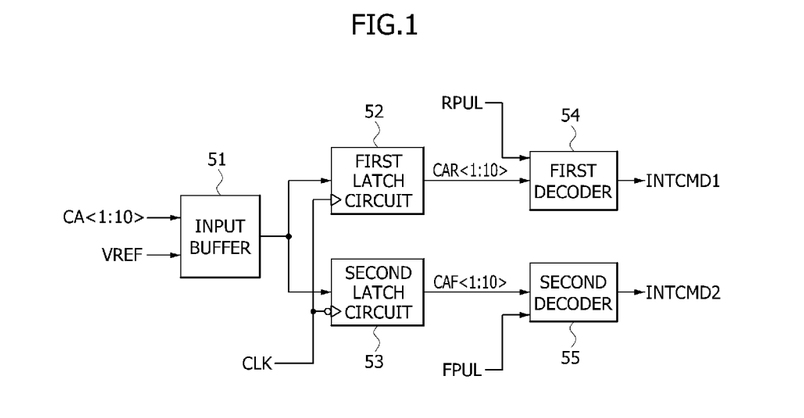
FIG. 1 is a block diagram illustrating an example of a configuration of a typical command decoder used in LPDDR2 chips.
Figure 2:
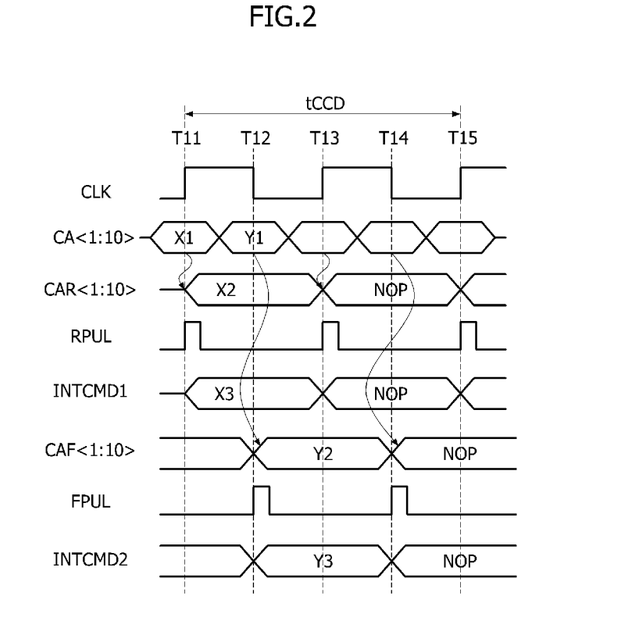
FIG. 2 is a timing diagram illustrating an example of an operation of a typical command decoder illustrated in FIG. 1.

FIG. 1 is a block diagram illustrating a configuration of a typical command decoder used in LPDDR2 chips, and FIG. 2 is a timing diagram illustrating an operation of a typical command decoder illustrated in FIG. 1.

As illustrated in FIGS. 1 and 2, a typical command decoder used in LPDDR2 chips may include an input buffer 51, a first latch circuit 52, a second latch circuit 53, a first decoder 54, and a second decoder 55. The input buffer 51 may buffer and receive first to tenth command address signals CA<1:10> in response to a reference voltage VREF. The first latch circuit 52 may latch the first to tenth command address signals CA<1:10> from the input buffer 51 in synchronization with rising edges of a clock pulse signal CLK, thereby generating first to tenth rising command address signals CAR<1:10>. The second latch circuit 53 may latch the first to tenth command address signals CA<1:10> from the input buffer 51 in synchronization with falling edges of the clock pulse signal CLK, thereby generating first to tenth falling command address signals CAF<1:10>.

The first decoder 54 may decode the first to tenth rising command address signals CAR<1:10> in synchronization with a rising pulse signal RPUL, thereby generating a first internal command INTCMD1. The second decoder 55 may decode the first to tenth falling command address signals CAF<1:10> in synchronization with a falling pulse signal FPUL, thereby generating a second internal command INTCMD2. The rising pulse signal RPUL may be an impulse signal generated in synchronization with the rising edges of the clock pulse signal CLK, and the falling pulse signal FPUL may be an impulse signal generated in synchronization with the falling edges of the clock pulse signal CLK.

Referring again to FIG. 2, the input buffer 51 may buffer and receive the first to tenth command address signals CA<1:10> in response to the reference voltage VREF, as described above. The command address signal (e.g., a signal X1) received at a first rising edge time T11 of the clock pulse signal CLK may be used in generation of the first internal command INTCMD1, and the command address signal (e.g., a signal Y1) received at a first falling edge time T12 of the clock pulse signal CLK may be used in generation of the second internal command INTCMD2.

The first latch circuit 52 may latch the signal X1 in synchronization with a first rising edge of the clock pulse signal CLK, thereby outputting a signal X2 as the first to tenth rising command address signals CAR<1:10>. The first decoder 54 may decode the signal X2 in synchronization with the rising pulse signal RPUL, thereby generating a signal X3 as the first internal command INTCMD1.

Similarly, the second latch circuit 53 may latch the signal Y1 in synchronization with a first falling edge of the clock pulse signal CLK, thereby outputting a signal Y2 as the first to tenth falling command address signals CAF<1:10>. The second decoder 55 may decode the signal Y2 in synchronization with the falling pulse signal FPUL, thereby generating a signal Y3 as the second internal command INTCMD2.

As described above, the typical command decoder may generate only a single first internal command INTCMD1 and a single second internal command INTCMD2 for a single column address signal (CAS) to CAS delay time (tCCD) period. Thus, the first latch circuit 52, the second latch circuit 53, the first decoder 54, and the second decoder 55 may unnecessarily generate no operation (NOP) pulses according to the first to tenth command address signals CA<1:10> received from the input buffer 51 at a second rising edge time T13 and a second falling edge time T14 of the clock pulse signal CLK for the single tCCD period. This may lead to an increase in power consumption of the command decoder. In addition, T15 is a third rising edge of the clock pulse signal CLK for the single tCCD period.

Further, according to the specification provided in the LPDDR2, information on the first and second internal commands INTCMD1 and INTCMD2 may be substantially included in the first to fifth command address signals CA<1:5> among the first to tenth command address signals CA<1:10>.

Figure 3:
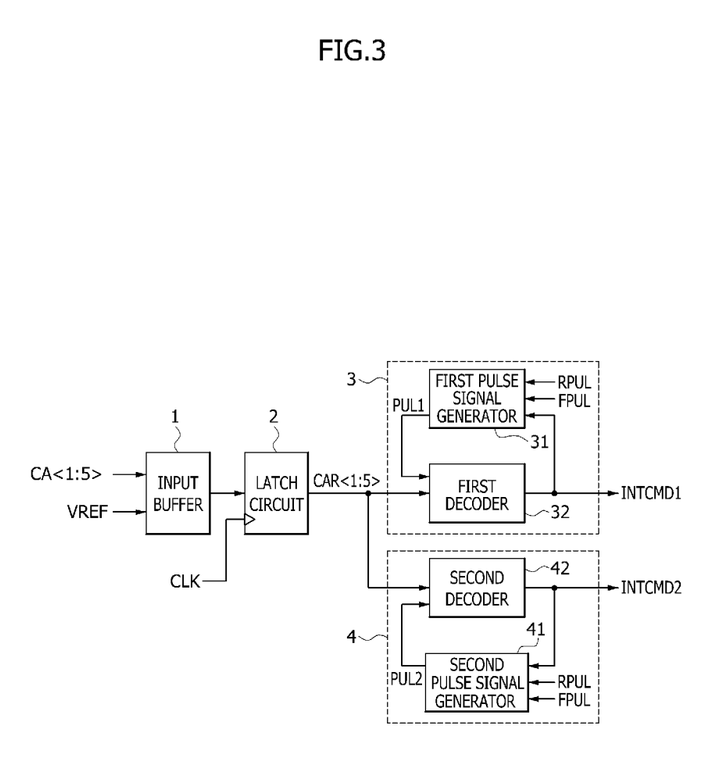
FIG. 3 is a block diagram illustrating an example of a configuration of a command decoder according to an embodiment.

FIG. 3 is a block diagram illustrating an example of a configuration of a command decoder according to an embodiment.

As illustrated in FIG. 3, a command decoder according to an embodiment may be configured to include an input buffer 1, a latch circuit 2, a first command generator 3, and a second command generator 4. The first command generator 3 may include a first pulse signal generator 31 and a first decoder 32. Similarly, the second command generator 4 may include a second pulse signal generator 41 and a second decoder 42.

The input buffer 1 may buffer and receive first to fifth command address signals CA<1:5> in response to a reference voltage VREF. Specifically, the input buffer 1 may receive the first to fifth command address signals CA<1:5> having information on commands and address through five pins for a single tCCD duration including two cycles of pulses constituting a clock pulse signal CLK. Each of the first to fifth command address signals CA<1:5> may be created to have command information at first and second rising edges of the clock pulse signal CLK for the single tCCD duration and to have address information at first and second falling edges of the clock pulse signal CLK for the single tCCD duration.

The latch circuit 2 may latch the first to fifth command address signals CA<1:5> output from the input buffer 1 in synchronization with rising edges of the clock pulse signal CLK, thereby outputting latched signals CAR<1:5>. More specifically, the latch circuit 2 may latch the first to fifth command address signals CA<1:5> output from the input buffer 1 in synchronization with a first rising edge of the clock pulse signal CLK for the single tCCD duration, thereby outputting the latched signals CAR<1:5>. In addition, the latch circuit 2 may latch the first to fifth command address signals CA<1:5> output from the input buffer 1 in synchronization with a second rising edge of the clock pulse signal CLK for the single tCCD duration, thereby outputting the latched signals CAR<1:5>.

The first pulse signal generator 31 may generate a first pulse signal PUL1 that occurs in response to a rising pulse signal RPUL and a falling pulse signal FPUL for a time period in which a first internal command INTCMD1 is generated. The first pulse signal PUL1 may include a pulse occurred in synchronization with the first rising edge of the clock pulse signal CLK for the single tCCD duration.

The first decoder 32 may decode the latched signals CAR<1:5> at the time that the pulse of the first pulse signal PUL1 occurs, thereby generating the first internal command INTCMD1. In the event that the first pulse signal PUL1 includes the pulse occurred in synchronization with the first rising edge of the clock pulse signal CLK for the single tCCD duration, the first decoder 32 may decode the latched signals CAR<1:5> generated at the first rising edge of the clock pulse signal CLK for the single tCCD duration, thereby generating the first internal command INTCMD1.

Since the first pulse signal PUL1 includes a pulse occurred in synchronization with the first rising edge of the clock pulse signal CLK, the first decoder 32 may not decode an unnecessary latched signal for the single tCCD duration. Consequently, the first decoder 32 may operate to minimize the power consumption thereof.

The second pulse signal generator 41 may generate a second pulse signal PUL2 that occurs in response to the rising pulse signal RPUL and the falling pulse signal FPUL for a time period in which a second internal command INTCMD2 is generated. The second pulse signal PUL2 may include a pulse occurred in synchronization with the second rising edge of the clock pulse signal CLK for the single tCCD duration.

The second decoder 42 may decode the latched signals CAR<1:5> at the time that the pulse of the second pulse signal PUL2 occurs, thereby generating the second internal command INTCMD2. In the event that the second pulse signal PUL2 includes the pulse occurred in synchronization with the second rising edge of the clock pulse signal CLK for the single tCCD duration, the second decoder 42 may decode the latched signals CAR<1:5> generated at the second rising edge of the clock pulse signal CLK for the single tCCD duration, thereby generating the second internal command INTCMD2.

Since the second pulse signal PUL2 includes a pulse occurred in synchronization with the second rising edge of the clock pulse signal CLK, the second decoder 42 may not decode an unnecessary latched signal for the single tCCD duration. Consequently, the second decoder 42 may operate to minimize the power consumption thereof.

Figure 4:
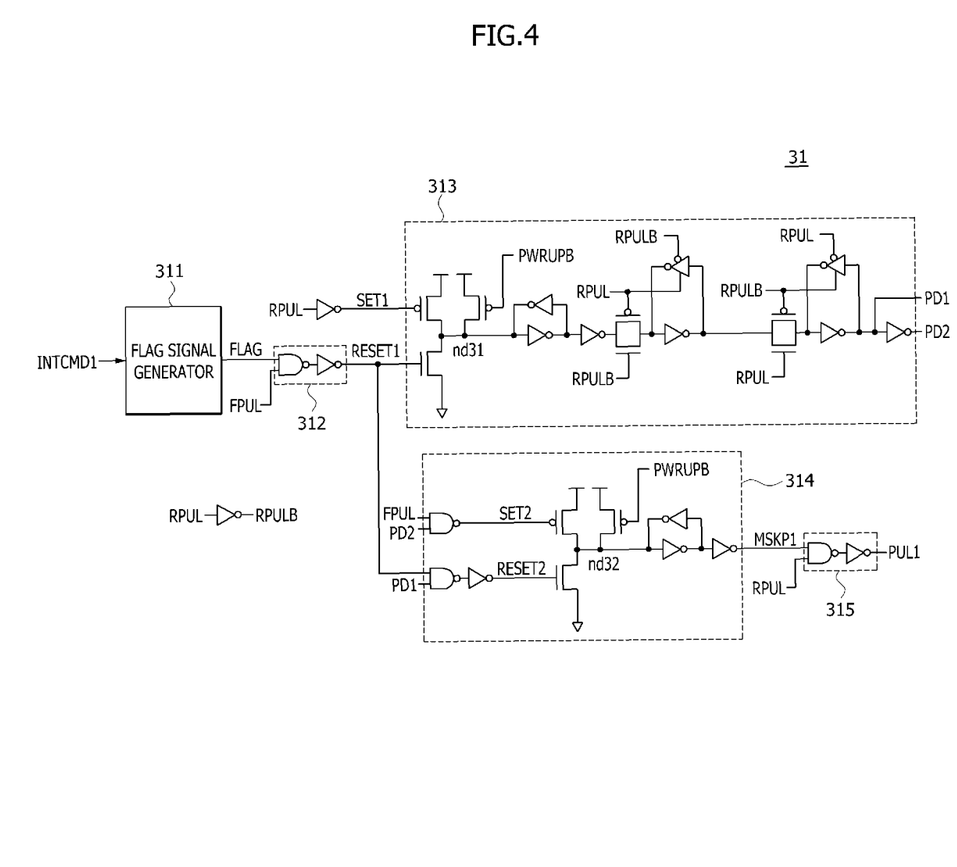
FIG. 4 is a block diagram illustrating an example of a first pulse signal generator of a command decoder illustrated in FIG. 3.
Figure 5:
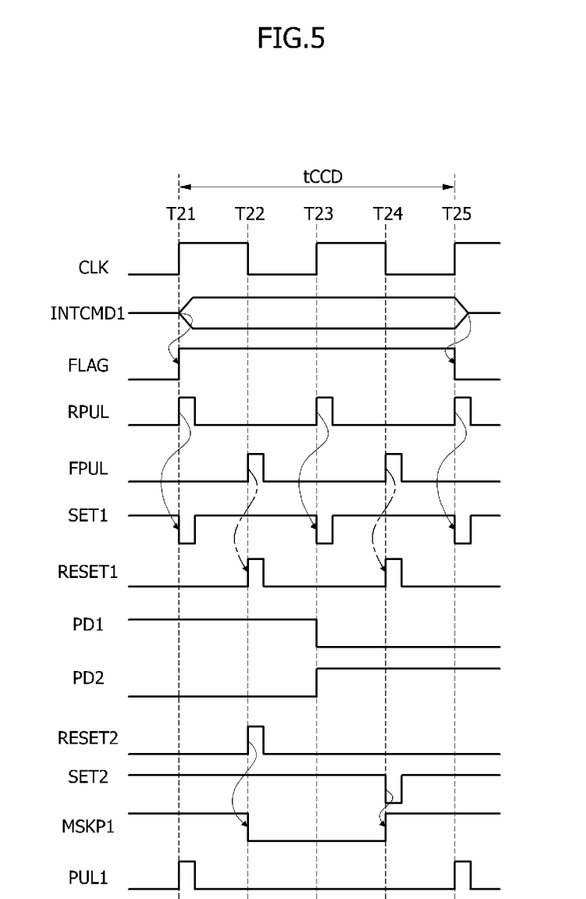
FIG. 5 is a timing diagram illustrating an example of an operation of a first pulse signal generator illustrated in FIG. 4.

FIG. 4 is a block diagram illustrating the first pulse signal generator 31 of the command decoder illustrated in FIG. 3, and FIG. 5 is a timing diagram illustrating an operation of the first pulse signal generator 31 illustrated in FIG. 4.

As illustrated in FIG. 4, the first pulse signal generator 31 may be configured to include a flag signal generator 311, a reset signal generator 312, a duration signal generator 313, a masking signal generator 314, and a buffer 315. The flag signal generator 311 may generate a flag signal FLAG enabled into a logic high voltage level in a time duration when the first internal command INTCMD1 is generated. The reset signal generator 312 may buffer the falling pulse signal FPUL in a time duration when the flag signal FLAG is enabled into a logic high voltage level, thereby generating a first reset signal RESET1. The duration signal generator 313 may receive the first reset signal RESET1, a first set signal SET1 generated by inverting the rising pulse signal RPUL (RPULB being an inverted RPUL), and the rising pulse signal RPUL, thereby generating a first duration signal PD1 and a second duration signal PD2 that do level transitions at the second rising edge of the clock pulse signal CLK for the single tCCD duration. The masking signal generator 314 may generate a first masking signal MSKP1 disabled from the first falling edge to the second falling edge of the clock pulse signal CLK in response to the first reset signal RESET1, the falling pulse signal FPUL, the first duration signal PD1 and the second duration signal PD2. The buffer 315 may buffer the rising pulse signal RPUL in response to the first masking signal MSKP1, thereby generating a first pulse signal PUL1. The rising pulse signal RPUL may include pulses that are generated in synchronization with rising edges of the clock pulse signal CLK, and the falling pulse signal FPUL may include pulses that are generated in synchronization with falling edges of the clock pulse signal CLK. As illustrated in FIG. 4, the PWRUPB signal is an inverted power up signal.

Now, an operation of the first pulse signal generator 31 is described with reference to FIG. 5 in the case when the single tCCD duration has a time duration from a level transition time T21 to a level transition time T25. The level transition time T21 may correspond to a first rising edge of the clock pulse signal CLK, and the level transition time T22 may correspond to a first falling edge of the clock pulse signal CLK. Further, the level transition time T23 may correspond to a second rising edge of the clock pulse signal CLK, and the level transition time T24 may correspond to a second falling edge of the clock pulse signal CLK. In addition, the level transition time T25 may correspond to a third rising edge of the clock pulse signal CLK.

The flag signal generator 311 may receive the first internal command INTCMD1 to generate the flag signal FLAG enabled into a logic high voltage level from the level transition time T21 to the level transition time T25. The operation about generation of the first internal command INTCMD1 will be described later.

The duration signal generator 313 may receive the first reset signal RESET1 and the first set signal SET1 to generate the first duration signal PD1 and the second duration signal PD2. Because the first set signal SET1 may be generated by inverting the rising pulse signal RPUL, the first set signal SET1 may include inverse pulses generated in synchronization with the level transition time T21 and the level transition time T23 for the single tCCD duration. The first reset signal RESET1 output from the reset signal generator 312 may include pulses generated in synchronization with the level transition time T22 and the level transition time T24 for the single tCCD duration. An output node ND31 of a first stage constituting the duration signal generator 313 may be pulled-up to have a logic high voltage level whenever the inverse pulses of the first set signal SET1 are input to the duration signal generator 313. In contrast, the output node ND31 of the first stage constituting the duration signal generator 313 may be pulled-down to have a logic low voltage level whenever the pulses of the first reset signal RESET1 are input to the duration signal generator 313. The signal at the output node ND31 may be changed into the first duration signal PD1 and the second duration signal PD2 in response to the rising pulse signal RPUL. In this case, the first duration signal PD1 may be changed from a logic high voltage level into a logic low voltage level at the level transition time T23, and the second duration signal PD2 may be changed from a logic low voltage level into a logic high voltage level at the level transition time T23.

The masking signal generator 314 may transmit the first reset signal RESET1 to the second reset signal RESET2 when the first duration signal PD1 has a logic high voltage level. Further, the masking signal generator 314 may transmit the falling pulse signal FPUL to the second set signal SET2 when the second duration signal PD2 has a logic high voltage level. The second reset signal RESET2 may include pulses generated in synchronization with the level transition time T22, and the second set signal SET2 may include inverse pulses generated in synchronization with the level transition time T24. Thus, since an internal node ND32 of the masking signal generator 314 may be pulled-down to have a logic low voltage level at the level transition time T22 and may be pulled-up to have a logic high voltage level at the level transition time T24, the first masking signal MSKP1 may be disabled to have a logic low voltage level from the level transition time T22 to the level transition time T24.

The buffer 315 may buffer the rising pulse signal RPUL in a time duration when the first masking signal MSKP1 is enabled into a logic high voltage level, thereby generating a first pulse signal PUL1. That is, when the first masking signal MSKP1 is disabled into a logic low voltage level, the pulses of the rising pulse signal RPUL cannot be transmitted into the first pulse signal PUL1. Accordingly, the first pulse signal PUL1 may include only the pulses generated in synchronization with the level transition time T21 (or T25) for the single tCCD duration.

As described above, the first pulse signal generator 31 may remove the pulse of the rising pulse signal RPUL, which are generated in synchronization with the second rising edge (e.g., the level transition time T23) of the clock pulse signal CLK for the single tCCD duration. That is, the first pulse signal generator 31 may extract only the pulses of the rising pulse signal RPUL, which are generated in synchronization with the first rising edge (e.g., the level transition time T21 or T25) of the clock pulse signal CLK for the single tCCD duration, thereby transmitting only the extracted pulses to the first pulse signal PUL1.

Figure 6:
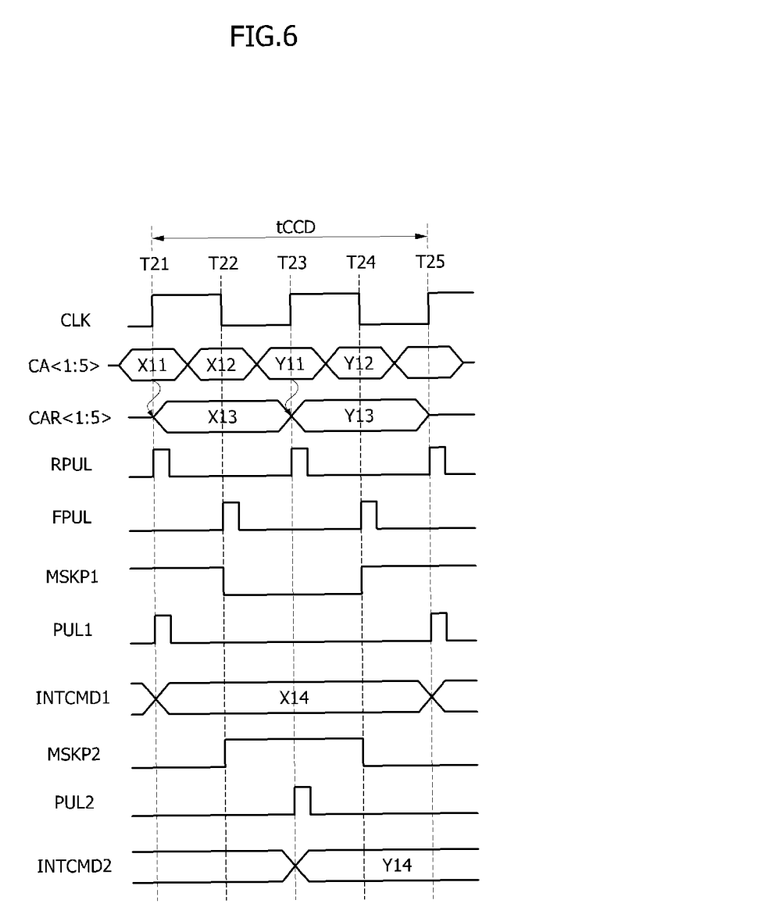
FIG. 6 is a timing diagram illustrating an example of an operation of a command decoder illustrated in FIG. 3.

FIG. 6 is a timing diagram illustrating an example of an operation of a command decoder illustrated in FIG. 3.

Referring to FIG. 6, each of the first to fifth command address signals CA<1:5> may include signals X11, X12, Y11, and Y12 which are sequentially input to the input buffer 1 for the single tCCD duration. The signals X11 may be created to correspond to the first to fifth command address signals CA<1:5> among the first to tenth command address signals CA<1:10> received in synchronization with the rising edge of the clock pulse signal CLK described with reference to FIGS. 1 and 2, and the signals X12 may be created to correspond to the sixth to tenth command address signals CA<6:10> among the first to tenth command address signals CA<1:10> received in synchronization with the rising edge of the clock pulse signal CLK described with reference to FIGS. 1 and 2. Further, the signals Y11 may be created to correspond to the first to fifth command address signals CA<1:5> among the first to tenth command address signals CA<1:10> received in synchronization with the falling edge of the clock pulse signal CLK described with reference to FIGS. 1 and 2, and the signals Y12 may be created to correspond to the sixth to tenth command address signals CA<6:10> among the first to tenth command address signals CA<1:10> received in synchronization with the falling edge of the clock pulse signal CLK described with reference to FIGS. 1 and 2. Thus, only the signals X11 and Y11 may include information on the first and second internal commands INTCMD1 and INTCMD2.

The latch circuit 2 may latch the first to fifth command address signals CA<1:5> output from the input buffer 1 in synchronization with the rising edge of the clock pulse signal CLK, thereby generating and outputting the latched signals CAR<1:5>. Accordingly, the latch circuit 2 may latch the signal X11 generated in synchronization with the level transition time T21 to output the signal X13 and may latch the signal Y11 generated in synchronization with the level transition time T23 to output the signal Y13.

The first pulse signal generator 31 may generate the first masking signal MSKP1 disabled to have a logic low voltage level from the level transition time T22 to the level transition time T24 and may generate the first pulse signal PUL1 including only the pulses which are occurred in synchronization with the first rising edge (e.g., the level transition time T21) for the single tCCD duration in response to the first masking signal MSKP1. Hence, because the first decoder 32 decodes the latched signal CAR<1:5> in response to the pulses of the first pulse signal PUL1 only at the first rising edge (e.g., only at the level transition time T21) for the single tCCD duration, the first internal command INTCMD1 may be generated in a time duration from the level transition time T21 to the level transition time T25, for example, for the single tCCD duration.

Additionally, the second pulse signal generator 41 may generate the second pulse signal PUL2 including only the pulses occurred in synchronization with the level transition time T23 in response to the second masking signal MSKP2 enabled to have a logic high voltage level in a time duration from the level transition time T22 to the level transition time T24 for the single tCCD duration. Thus, because the second decoder 42 decodes the latched signal CAR<1:5> in response to the pulses of the second pulse signal PUL2 only at the second rising edge (e.g., only at the level transition time T23) for the single tCCD duration, the second internal command INTCMD2 may be generated in a time duration from the level transition time T23 to the next level transition time T23.

According to the embodiments set forth above, command decoders can utilize only first to fifth command address signals CA<1:5> to generate first and second internal commands INTCMD1 and INTCMD2. That is, the command decoders according to the embodiments can be designed to reduce the number of input pins to which command address signals CA<1:5> are applied, by a half multiple, as compared with the typical command decoders. Therefore, packaging costs can be significantly reduced. Moreover, the command decoders according to the embodiments may latch and decode only signals including command information using a first masking signal MSKP1 and a second masking signal MSKP2 among the first to fifth command address signals CA<1:5> input at the time of every clock edge. As a result, power consumption of the command decoders can be lowered.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A command decoder comprising:
an input buffer configured for buffering and receiving command address signals having address information and command information at first, second, third, and fourth edges of a clock pulse signal according to a reference voltage;

a latch circuit configured for latching the command address signals output from the input buffer at the first and third edges of the clock pulse signal to generate and output latched signals;

a first command generator configured for decoding the latched signals output from the latch circuit at the first edge of the clock pulse signal to generate and output a first internal command; and a second command generator configured for decoding the latched signals output from the latch circuit at the third edge of the clock pulse signal to generate and output a second internal command.

2. The command decoder of claim 1, wherein the first and third edges of the clock pulse signal are rising edges, and the second and fourth edges of the clock pulse signal are falling edges.

3. The command decoder of claim 1, wherein the first command generator includes:

a first decoder configured for decoding the latched signals at a time that a pulse of a first pulse signal occurs, thereby generating the first internal command; and a first pulse signal generator configured for generating the first pulse signal including a pulse occurred in synchronization with the first edge of the clock pulse signal when the first internal command is generated.

4. The command decoder of claim 3, wherein the first pulse signal generator buffers a rising pulse signal including pulses generated in synchronization with the first and third edges of the clock pulse signal in response to a first masking signal, thereby generating the first pulse signal.

5. The command decoder of claim 4, wherein the first masking signal is disabled to remove a pulse of the rising pulse signal, which is generated in synchronization with the third edge of the clock pulse signal.

6. The command decoder of claim 3, wherein the first pulse signal generator includes:

a flag signal generator configured for generating a flag signal that is enabled when the first internal command is generated;

a reset signal generator configured for buffering a falling pulse signal including pulses generated in synchronization with the second and fourth edges of the clock pulse signal when the flag signal is enabled to generate a first reset signal;

a duration signal generator configured for generating first and second duration signals that perform level transitions at the third edge of the clock pulse signal in response to the first reset signal, a rising pulse signal including pulses generated at the first and third edges of the clock pulse signal, and a first set signal generated by inverting the rising pulse signal;

a masking signal generator configured for generating a first masking signal that is disabled from the second edge to the fourth edge of the clock pulse signal in response to the first reset signal, the falling pulse signal, the first duration signal, and the second duration signal; and a buffer configured for buffering the rising pulse signal in response to the first masking signal to generate a first pulse signal.

7. The command decoder of claim 1, wherein the second command generator includes:

a second decoder configured for decoding the latched signals at a time that a pulse of a second pulse signal occurs, thereby generating the second internal command; and a second pulse signal generator for generating the second pulse signal including a pulse occurred in synchronization with the second edge of the clock pulse signal when the second internal command is generated.

8. The command decoder of claim 7, wherein the second pulse signal generator buffers a falling pulse signal including pulses generated in synchronization with the second and fourth edges of the clock pulse signal in response to a second masking signal, thereby generating the second pulse signal.

9. The command decoder of claim 8, wherein the second masking signal is disabled to remove a pulse of the falling pulse signal, which is generated in synchronization with the fourth edge of the clock pulse signal.

10. A command decoder comprising:

a latch circuit configured for latching command address signals having address information and command information in a time duration including first, second, third, and fourth edges of a clock pulse signal to generate latched signals, the command address signals being latched at the first and third edges of the clock pulse signal;

a first decoder configured for decoding the latched signals at the time that a pulse of a first pulse signal occurs, thereby generating a first internal command; and a first pulse signal generator configured for generating the first pulse signal including a pulse occurred in synchronization with the first edge of the clock pulse signal when the first internal command is generated.

11. The command decoder of claim 10, wherein the first and third edges of the clock pulse signal are rising edges, and the second and fourth edges of the clock pulse signal are falling edges.

12. The command decoder of claim 10, wherein the first pulse signal generator buffers a rising pulse signal including pulses generated in synchronization with the first and third edges of the clock pulse signal in response to a first masking signal, thereby generating the first pulse signal.

13. The command decoder of claim 12, wherein the first masking signal is disabled to remove a pulse of the rising pulse signal, which is generated in synchronization with the third edge of the clock pulse signal.

14. The command decoder of claim 10, wherein the first pulse signal generator includes:

a flag signal generator configured for generating a flag signal that is enabled when the first internal command is generated;

a reset signal generator configured for buffering a falling pulse signal including pulses generated in synchronization with the second and fourth edges of the clock pulse signal when the flag signal is enabled to generate a first reset signal;

a duration signal generator configured for generating first and second duration signals that perform level transitions at the third edge of the clock pulse signal in response to the first reset signal, a rising pulse signal including pulses generated at the first and third edges of the clock pulse signal, and a first set signal generated by inverting the rising pulse signal;

a masking signal generator configured for generating a first masking signal that is disabled from the second edge to the fourth edge of the clock pulse signal in response to the first reset signal, the falling pulse signal, the first duration signal and the second duration signal; and a buffer configured for buffering the rising pulse signal in response to the first masking signal to generate a first pulse signal.

15. The command decoder of claim 10, further comprising:
a second decoder configured for decoding the latched signals at a time that a pulse of a second pulse signal occurs, thereby generating the second internal command; and
a second pulse signal generator for generating the second pulse signal including a pulse occurred in synchronization with the second edge of the clock pulse signal when the second internal command is generated.

16. The command decoder of claim 15, wherein the second pulse signal generator buffers a falling pulse signal including pulses generated in synchronization with the second and fourth edges of the clock pulse signal in response to a second masking signal, thereby generating the second pulse signal.

17. The command decoder of claim 16, wherein the second masking signal is disabled to remove a pulse of the falling pulse signal, which is generated in synchronization with the fourth edge of the clock pulse signal.

18. A command decoder comprising:
an input buffer configured for buffering and receiving command address signals having address information and command information at first and third edges of a clock pulse signal according to a reference voltage; and
a latch circuit configured for latching the command address signals output from the input buffer at the first and third edges of the clock pulse signal to generate and output latched signals.

19. A command decoder of claim 18, further comprising:
a first command generator configured for decoding the latched signals output from the latch circuit at the first edge of the clock pulse signal to generate and output a first internal command.

20. A command decoder of claim 19, further comprising:
a second command generator configured for decoding the latched signals output from the latch circuit at the third edge of the clock pulse signal to generate and output a second internal command.

* * * * *